US009160050B2

(12) United States Patent
Cammarata

(10) Patent No.: US 9,160,050 B2
(45) Date of Patent: Oct. 13, 2015

(54) PLANAR BALUN TRANSFORMER DEVICE

(71) Applicant: STMicroelectronics S.r.l., Agrate Brianza (IT)

(72) Inventor: Roberto Cammarata, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 168 days.

(21) Appl. No.: 13/936,651

(22) Filed: Jul. 8, 2013

(65) Prior Publication Data

US 2014/0022027 A1 Jan. 23, 2014

(30) Foreign Application Priority Data

Jul. 17, 2012 (IT) .............................. MI2012A1238

(51) Int. Cl.

| | |
|---|---|
| ***H03H 7/42*** | (2006.01) |
| ***H01P 5/10*** | (2006.01) |
| ***H01P 11/00*** | (2006.01) |
| *H01P 3/08* | (2006.01) |

(52) U.S. Cl.

CPC . *H01P 5/10* (2013.01); *H01P 11/00* (2013.01)

(58) Field of Classification Search

CPC ............ H03H 7/42; H01F 17/00; H01F 27/28

USPC ....................... 333/25, 26; 336/200, 180, 215

See application file for complete search history.

(56) References Cited

U.S. PATENT DOCUMENTS

| | | | | | |
|---|---|---|---|---|---|
| 5,061,910 | A * | 10/1991 | Bouny | ............................ | 333/26 |
| 5,818,308 | A * | 10/1998 | Tanaka et al. | ................... | 333/26 |
| 6,294,965 | B1 * | 9/2001 | Merrill et al. | ................... | 333/26 |
| 6,765,469 | B2 * | 7/2004 | Sortor | ........................... | 336/200 |
| 6,917,254 | B2 * | 7/2005 | Kaehs | ........................... | 336/200 |
| 7,302,249 | B1 * | 11/2007 | Fudem et al. | ................. | 455/327 |
| 7,495,525 | B2 * | 2/2009 | Ilkov et al. | ...................... | 333/26 |
| 8,917,150 | B2 * | 12/2014 | Vanhille et al. | ................. | 333/26 |
| 2003/0030994 | A1 * | 2/2003 | Takaya et al. | ................. | 361/728 |
| 2011/0148542 | A1 * | 6/2011 | Pache et al. | ..................... | 333/25 |

FOREIGN PATENT DOCUMENTS

| | | | |
|---|---|---|---|
| JP | 11214904 | A | 8/1999 |
| JP | 2003115708 | A | 4/2003 |
| JP | 2008227006 | A | 9/2008 |

OTHER PUBLICATIONS

Italian Search Report and Written Opinion for IT MI2012A001238 mailed Mar. 8, 2013 (7 pages).

* cited by examiner

*Primary Examiner* — Dean Takaoka

(74) *Attorney, Agent, or Firm* — Gardere Wynne Sewell LLP

(57) ABSTRACT

An electric transformer device (balun) is formed on a support plate having a first base face and an opposite second base face. The balun includes a first port (40) connectable to an electrical line for a differential signal and a second port connectable to an electrical line for a single-ended signal. A first printed conductive track is associated to the first base face of the support plate for connecting the first port to the second port. A printed conductive path is associated to the second base face of the support plate for connecting the first port to the second port. The printed conductive path is formed of a symmetric second and third printed conductive tracks.

20 Claims, 2 Drawing Sheets

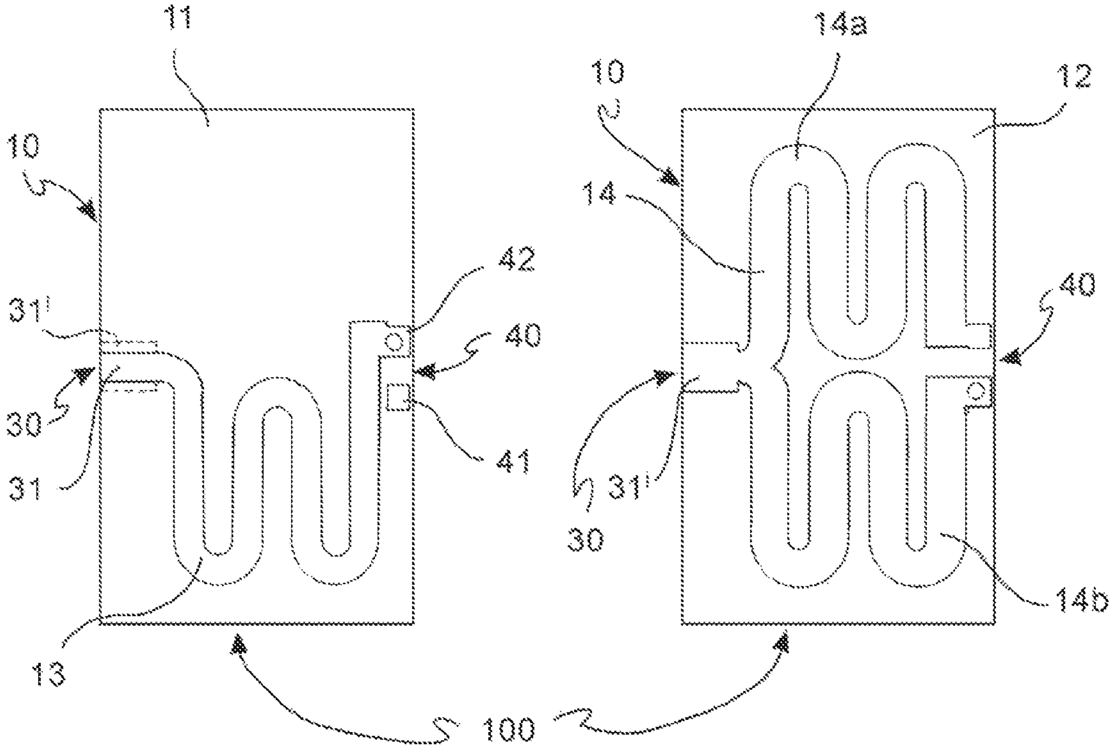
FIG. 2
FIG. 3
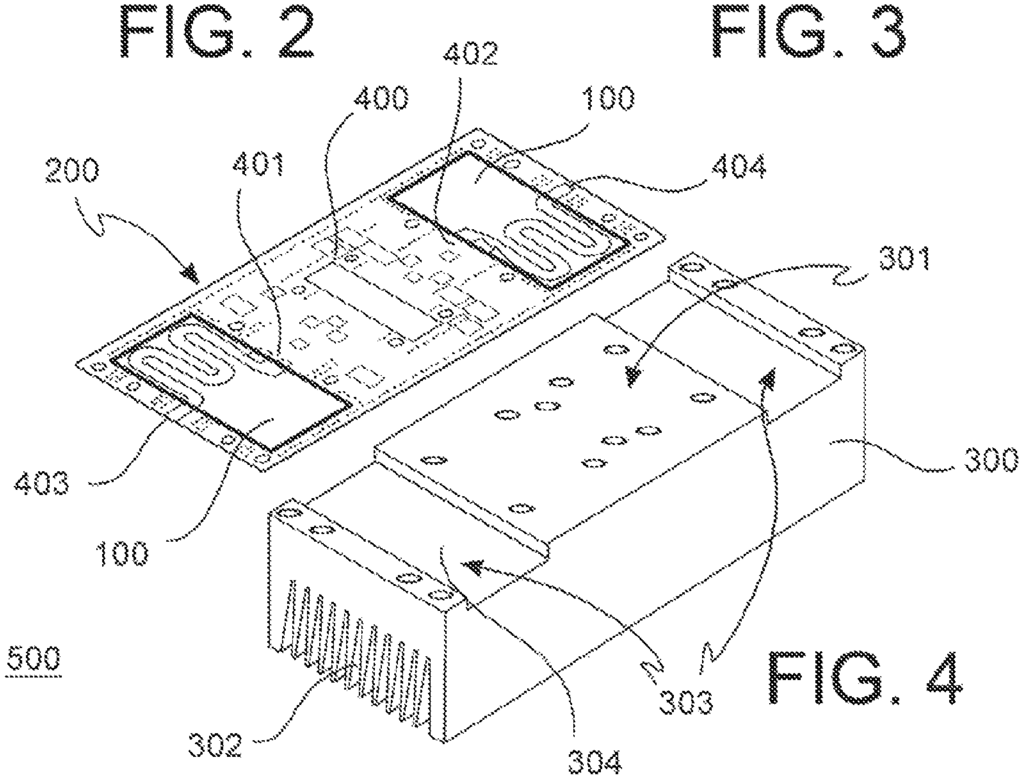
FIG. 4

PLANAR BALUN TRANSFORMER DEVICE

PRIORITY CLAIM

This application claims priority from Italian Application for Patent No. MI2012A001238 filed Jul. 17, 2012, the disclosure of which is incorporated by reference.

TECHNICAL FIELD

The present invention relates to a transformer device to adapt an unbalanced or single-ended signal transmission line to a two-wire balanced signal line or of the differential type, also known with the term “balun”. In particular, the invention relates to a planar balun transformer device for radio-frequency (RF) power applications.

BACKGROUND

A “balun” device (from the acronym of the English terms BALanced/UNbalanced) is a transformer connected between a balanced source or load and an unbalanced source or load. As it is known, a balanced signal line comprises two conductors for the signal that are passed through by equal currents in opposite directions. An unbalanced signal line comprises only one conductor passed through by a current and the common ground potential GND represents the return path for such current.

The electronic devices for radio-frequency (RF) applications without wires, or wireless applications, generally comprise respective input/output terminals for signals of the balanced type, i.e., input/output terminals of the differential type, to minimize the effects of substrate inductances and to improve the common mode rejection. Such electronic devices with input/output differential terminals comprise, for example, mixers, modulators, and voltage-controlled oscillators, or VCO.

As it is known, on the balanced output terminals of such devices, differential signals exist, which have to be mutually combined to generate an output signal of the single-ended type to be supplied outwardly. To this purpose, the balun device is suitable for connecting such balanced output terminals to a single unbalanced output terminal in order to convert the differential output signals into an output signal of the single-ended type. Similarly, the balun is suitable for converting an unbalanced or single-ended input signal into differential input signals for the above-mentioned electronic devices.

In the realization of printed circuit boards or PCB for RF applications, it is known to manufacture a balun transformer circuit including a first portion that is manufactured by means of a metal track that is printed on one of the planar surfaces of the substrate board of the circuit. On the same planar surface of the board, such known balun further comprises a respective second transformer portion, generally manufactured by a coaxial cable, connected to the first printed portion. In particular, the printed metal track is shaped so as to comprise a first and a second terminal end connected, for example, by welding, to corresponding terminal ends of the coaxial cable.

Such known balun transformer produced on a board of a printed circuit is not free from defects.

In fact, the Applicant has verified that an inaccurate shaping of the coaxial cable before its securing on the board, or an imprecision in carrying out the welding that connects both the core and the cladding of the coaxial cable to the first and the second terminal end of the printed metal track can introduce parasitic effects (for example, undesired phase displacements) that alter the converted signal. Furthermore, in radio-frequency applications, for example, at frequencies of the order of about 1 GHz, such parasitic effects are mostly apparent, such as to compromise the predictability of the signals converted by the balun.

SUMMARY

There is a need in the art to provide and make available an electric transformer device of a printed circuit board (PCB) in order to adapt an electrical line for a differential signal to an electrical line for a single-ended signal, also known by the term balun, allowing at least partially overcoming the above-mentioned drawbacks relatively to the above-mentioned balun transformer of a known type.

Such an object is achieved by an electric transformer device, or balun, in accordance the claims.

Electronic power amplification equipment for radio-frequency signals may comprise a board of a printed electronic circuit including the balun transformer device as described.

In an embodiment, an electric transformer device configured to adapt an electrical line for differential signal to an electrical line for single-ended signal comprises: a support plate having a first base face and an opposite second base face; a first port connectable to the electrical line for differential signal; a second port connectable to the electrical line for single-ended signal; a first printed conductive track associated to said first base face of the support plate for connecting said first port to said second port; and a printed conductive path associated to said second base face of the support plate for connecting said first port to said second port.

In an embodiment, a power amplification electronic equipment of signals for radio-frequency comprises: a heat sink support in metal material; a board of a printed electronic circuit that is secured to said heat sink support, said board comprising a support plate having a first base face and an opposite second base face, said board including at least one electric transformer device comprising: a first port connectable to an electrical line for a differential signal; a second port connectable to an electrical line for a single-ended signal; a first printed conductive track associated to said first base face of the support plate for connecting said first port to said second port; and a printed conductive path associated to said second base face of the support plate for connecting said first port to said second port.

In an embodiment, a method for manufacturing an electric transformer device to adapt an electrical line for differential signal to an electrical line for single-ended signal, comprises the steps of: securing a first metal sheet on a first base face of a support plate; securing an opposite second metal sheet on a second base face of the support plate; said first and second metal sheet being connected to the respective base face substantially along the entire face surface; performing a selective chemical removal of the metal from said first and second metal sheet, said selective chemical removal: shaping a first conductive track associated to said first base face of the support plate, and shaping a conductive path associated to said second base face of the support plate; providing for a first port and a second port of the transformer device that are connectable to the electrical line for differential signal and to the electrical line for single-ended signal, respectively; and connecting said first port to said second port via said first conductive track and said conductive path.

BRIEF DESCRIPTION OF THE DRAWINGS

Further characteristics and advantages of the electric transformer device, or balun, will be apparent from the description set forth below of preferred exemplary embodiments, given by way of non-limiting, indicative example, with reference to the annexed figures, in which:

FIGS. 2 and 3 illustrate top and bottom views, respectively, of the balun transformer device of FIG. 1; and FIG. 4 schematically illustrates in an exploded perspective view an amplification electronic equipment that comprises a board of a printed electronic circuit securable to a heat sink support, in which such board includes two balun transformer devices.

DETAILED DESCRIPTION OF THE DRAWINGS

Figure 1:
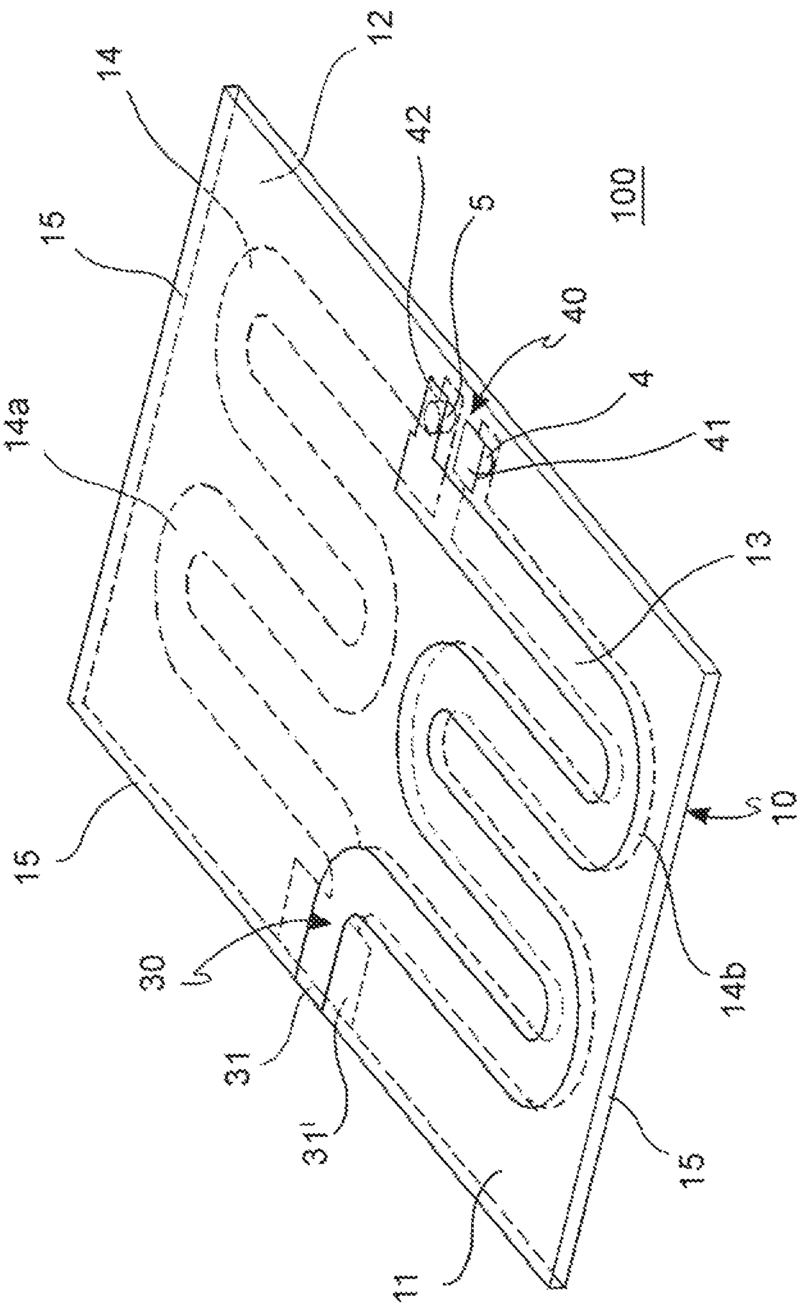
FIG. 1 schematically illustrates in a perspective view a balun transformer electrical device to adapt an unbalanced electric signal line to a balanced signal line

With reference to the FIGS. 1-3, an example of an electric transformer device of a printed circuit board (Printed Circuit Board or PCB) is now described to adapt an electrical line for a balanced or differential signal to an electrical line for an unbalanced or single-ended signal, and it is indicated in general with the numeral reference 100. Such a device is also indicated by those skilled in the art with the term "balun" (BALanced/UNbalanced).

Herein below, the electric transformer device of a printed circuit board or balun 100 will be indicated, for sake of simplicity, also as balun transformer device, or simply balun transformer. In the above-mentioned figures, similar or analogous elements are indicated with the same reference numerals.

In particular, the balun transformer device 100 is received on a support plate 10 of the printed circuit board PCB that is substantially planar and has a substantially constant thickness. In the FIGS. 1-3, only one portion of the above-mentioned support plate 10 is shown, which, beside the balun transformer 100, can house also other circuits and/or electronic devices, such as, for example, power amplifiers.

In more detail, such support plate 10 comprises a first base face 11 and an opposite second base face 12. Such first 11 and second 12 base face represent the faces of the plate having a surface extension that is larger than the surface extension of the side faces 15 of the plate 10 that are configured to mutually join the above-mentioned first 11 and second 12 base face.

The support plate 10 of the printed circuit board PCB represents the circuit substrate, and it is made of a dielectric material having reduced losses and self-extinguishing characteristics. For example, the support plate 10 is made of ROGER 4350B™. Such material has, for example, a dielectric constant equal to about 3.5. The support plate 10 can be manufactured also by employing other materials having dielectric constants ranging between 2.1 (for example, dielectrics based on Teflon PTFE) and 10 (for example, dielectrics based on ceramic powders).

Furthermore, relatively to the applications, the thickness of the support plate 10, i.e., the distance between the first 11 and the second 12 base face, may range between 0.254 mm and 1.524 mm. In the example of the invention, the thickness of the support plate 10 is about 1.524 mm.

The balun transformer 100 comprises a first port 40 connectable to the electrical line for differential signal, and a second port 30 connectable to the electrical line for single-ended signal. Such electrical lines for differential or single-ended signals are of a known type and are not shown in detail in the FIGS. 1-3.

Furthermore, the balun transformer 100 comprises a first printed conductive track 13 associated to the first base face 11 of the support plate 10 and configured to connect the first port 40 to the second port 30.

In addition, the balun transformer 100, advantageously, comprises a printed conductive path 14 associated to the second base face 12 of the support plate 10 for connecting the first port 40 to the second port 30. Such a printed conductive path 14 is shown in phantom in FIG. 1, and in FIG. 3 in more detail.

In such FIG. 3, the printed conductive path 14 comprises a second 14*a* and a third 14*b* conductive tracks, each of which is configured to connect the first port 40 to the second port 30.

It shall be noted that the first 13, the second 14*a*, and the third 14*b* conductive track of the balun transformer 100 are metal tracks made of, for example, copper. Such copper tracks 13, 14*a*, and 14*b* are obtained by means of processing operations of the substrate plate 10, in particular, following an application on each of the two base faces 11, 12 of a layer or metal sheet, in particular in copper, secured to the same base face, for example, with a thermal-adhesive glue. Such a copper sheet has a thickness that can range between 17 μm and 70 μm. In the example of the invention, such copper sheet has a nominal thickness of about 35 μm.

In more detail, the copper conductive tracks 13, 14*a*, and 14*b* of the balun transformer 100 are printed, i.e., are obtained by carrying out a selective chemical removal of the copper of the above-mentioned layer or metal sheet by a photo-etching technique of a known type.

In the example of the FIGS. 1-3, the above-mentioned copper tracks 13, 14*a*, 14*b* of the balun transformer 100 are, preferably, shaped so as to form a serpentine path, but other configurations are possible. It shall be noted that each of the copper tracks 13, 14*a*, 14*b* represents a signal transmission line advantageously having a length (i.e., the serpentine path of the tracks between the first 40 and the second 30 ports) of about $\lambda/4$, where $\lambda$ represents the wavelength of the signal at the center of the pass-band of the balun transformer 100. It shall be noted that the operative frequency band of the balun transformer 100 of the invention is about 760-960 MHz, i.e., the transformer operates in radio-frequency, RF.

Furthermore, an then illustrated example, the first conductive track 13 has a width of about 3 mm, the second 14*a* and third 14*b* conductive tracks have a width of about 4 mm.

In particular, the second copper track 14*a* is substantially symmetrical to the third track 14*b*, in order to ensure a phase compensation of the signal converted by the balun 100.

Furthermore, the balun transformer 100 is configured to process RF signals having powers ranging between about 10 Watts and about 500 Watts. The insertion loss, i.e., the power loss of the signal, following the conversion performed by the balun 100, is typically of about 0.1 dB.

Furthermore, the support plate 10 of the transformer 100 comprises respective through holes, or "via holes", obtained in a direction substantially orthogonal to the first 11 and the second 12 base face. Following a metallization of such via holes, for example, by a galvanic deposition method, the copper layer of the first base face 11 and the copper layer of the second base face 12 of the support plate 10 are mutually electrically connected.

In particular, in the example of FIG. 1, the balun transformer 100 comprises a first 4 and a second 5 metallized via hole. Such first 4 and second 5 metallized via hole have, for example, a diameter of about 1 mm, and are electrically insulated one from the other.

In particular, the first via hole 4 is configured to connect the third conductive track 14*b* with a first electrical terminal 41 of the first port 40 located at the first base face 11 of the plate 10. Furthermore, the second metallized via hole 5 is configured to connect the second conductive track 14*a* with a second electrical terminal 42 of the first port 40 located at the first base face 11. In other terms, the second via hole 5 is suitable to mutually connect the first 13 conductive copper track with the second 14*a* copper track.

It shall be noted that the above-mentioned first 41 and second 42 electrical terminal of the balun transformer 100 are connectable with respective input or output terminals of the differential type of electronic devices, such as, for example, mixers, modulators, voltage-controlled oscillators (VCOs), power amplifiers.

The second port 30 comprises a single electrical terminal 31 related to the ground potential GND. Such ground potential GND is applied to the common portion 31' of the second 14*a* and third 14*b* conductive track. In particular, the electrical terminal 31 is connectable to an unbalanced signal line that, in turn, is connected to, for example, an output antenna or a driver device inputting the single-ended signal to the balun transformer 100.

Following the reception of an unbalanced signal at the electrical terminal 31, the balun transformer 100 provides a balanced or differential signal between the above-described first 41 and second 42 electrical terminals.

In a further embodiment, the balun transformer 100 of the invention can comprise two groups of metallized holes, in which each group is suitable to replace the above-described first 4 and second 5 via hole, respectively. In particular, each of such groups of metallized holes can comprise 5-6 holes, each having a diameter of about 0.5 mm. All the holes of the above-mentioned groups are mutually short-circuited. Instead, the holes of different groups are mutually electrically insulated.

It shall be noted that the manufacturing of groups of metallized holes allows reducing the effects of parasitic inductances between the metal tracks of the first base face 11 and the second base face 12. In this way, the impedance observed at the first port 40 of the balun transformer 100, i.e., between the first terminal 41 and the second terminal 42, is substantially resistive, and consequently, the phase displacement effects of the signal that is present at such first port 40 are minimized.

It shall be noted that the balun transformer 100 of the invention has, for example, a conversion ratio of 1:1 and it is configured to show, both at the single-ended port 30 and at the differential port 40, an impedance of about 50 Ohms. The balun transformer 100 can also be designed so as to have a different conversion ratio and different nominal impedances at the ports 30 and 40. This is obtained, for example, by varying the widths of the first 13, the second 14*a*, and the third 14*b* conductive track, as well as the thickness of the support plate 10.

A power amplification electronic equipment of signals for radio-frequency (RF) applications is schematically shown in FIG. 4 and generally indicated with the reference numeral 500. Such amplification electronic equipment 500 comprises a board 200 of a printed electronic circuit, or PCB, securable to a heat sink support 300 in a metal material, provided with cooling fins 302. In particular, such board 200 includes at least a balun transformer 100 according to the invention, in the example, two baluns 100, and it is securable to the sink 300 by means of screws, rivets, or similar securing means. Such amplification electronic equipment 500 can be employed, for example, in a radio base station for mobile telephone systems.

When the board 200 is secured to the heat sink 300, the latter is suitable to provide the reference ground potential GND to the circuits housed in the board 200 and to the balun transformers 100 itself.

The board 200 comprises an electronic circuit portion 400 that can include, for example, one or more power amplifiers that are interposed between the above-mentioned balun transformers 100. Such electronic circuit portion 400 is configured to process the differential signals received at a respective differential input port 401 and to generate corresponding differential output signals at a differential output port 402.

In particular, the balun transformers 100 of the board 200 operate so as to adapt the differential input 401 and output 402 ports of the electronic circuitry 400, respectively, with an input terminal 403 and an output terminal 404 of the board 200, both referring to the ground potential GND.

Furthermore, advantageously, the heat sink 300 comprises, at a body portion 301 that is arranged to secure the board 200 and opposite to the cooling fins 302, respective recesses 303, for example, of a rectangular shape. Such recesses 303 are suitable to move the second base face 12 of the balun transformer 100, i.e., the respective second 14*a* and third 14*b* copper track, away from the heat sink 300 body, so as to ensure a proper operation thereof. If a bottom wall 304 of such recesses 303 is advantageously located at a distance of about 2-3 mm from the second base face 12 of the balun 100, the interference effects of the sink 300 body with the same balun transformer 100 are minimized.

The electric transformer device 100 of the balun type of a printed circuit board (PCB) for RF applications of the invention has a number of advantages compared to the balun devices of the known type.

In particular, the balun transformer 100 with a planar structure, in which the copper tracks 13, 14*a*, 14*b* are printed on both faces 11, 12 of the support plate 10 is simpler to be produced compared to the known transformers, since it does not need complex shaping and welding operations of the coaxial cable. In other terms, the balun transformer 100 has a reproducible structure, and it is easily built in also in the case of printed circuit boards with complex layouts.

Furthermore, electric simulations and a number of practical implementations show that the balun transformer 100 efficiently operates in the particular field of the radio-frequency power applications, and it is easier to be manufactured, compared to the balun devices of a known type.

Furthermore, by reducing the thickness of the dielectric support plate 10 and by reducing the wavelength λ of the signal that can be processed, it is possible to increase the passing band of the balun transformer 100, bringing it to operative frequencies in the order of 2 GHz, i.e., at the frequencies in which the radio-base stations for third-generation (3G) mobile telephone systems operate in accordance with the UMTS (Universal Mobile Telecommunications System) communication standard.

To the embodiments of the above-described balun transformer device, one of ordinary skill in the art, in order to meet contingent needs, will be able to make modifications, adaptations, and replacements of elements with other functionally equivalent ones, without departing from the scope of the following claims. Each of the characteristics described as belonging to a possible embodiment can be implemented independently from the other embodiments described.

What is claimed is:

1. An electric transformer device configured to adapt an electrical line for a differential signal to an electrical line for a single-ended signal, comprising:

a support plate having a first base face and an opposite second base face;

a first port connectable to the electrical line for the differential signal;

a second port connectable to the electrical line for the single-ended signal;

a first conductive track associated to said first base face of the support plate and electrically connecting said first port to said second port; and a conductive path associated to said second base face of the support plate, wherein said conductive path comprises:

a second conductive track electrically connecting said first port to said second port; and a third conductive track electrically connecting said first port to said second port.

2. The electric transformer device according to claim 1, wherein said first, second and third conductive tracks are metal tracks made of copper.

3. The electric transformer device according to claim 2, wherein said first, second and third conductive tracks are obtained by means of a selective chemical removal operation of the copper from a copper sheet that is secured on each of said first and second base faces of the support plate.

4. The electric transformer device according to claim 2 wherein said copper has a thickness ranging between 17 μm and 70 μm.

5. The electric transformer device according to claim 1, wherein said first, second and third conductive tracks are each shaped so as to form a serpentine path.

6. The electric transformer device according to claim 1, wherein each of said first, second and third conductive tracks has a length of about λ/4, where λ represents a wavelength of the signal at a center of a pass-band of the electric transformer device.

7. The electric transformer device according to claim 6, having an operative frequency band ranging between 760-960 MHz.

8. The electric transformer device according to claim 1, wherein said second conductive track is substantially symmetrical relative to the third conductive track.

9. The electric transformer device according to claim 1, configured to process radio-frequency signals with powers ranging between about 10 Watts and about 500 Watts.

10. The electric transformer device according to claim 1, having an insertion loss of about 0.1 dB.

11. A power amplification electronic equipment of signals for radio-frequency, comprising:

a heat sink support in metal material;

a board of a printed electronic circuit that is secured to said heat sink support, said board comprising a support plate having a first base face and an opposite second base face, said board including at least one electric transformer device comprising:

a first port connectable to an electrical line for a differential signal;

a second port connectable to an electrical line for a single-ended signal;

a first conductive track associated to said first base face of the support plate and electrically connecting said first port to said second port; and a conductive path associated to said second base face of the support plate, wherein said conductive path comprises:

a second conductive path electrically connecting said first port to said second port; and a third conductive track electrically connecting said first port to said second port.

12. The power amplification electronic equipment according to claim 11, wherein said heat sink support comprises at least one recess configured to separate the second base face of said at least one electric transformer device away from a body of the heat sink support.

13. The power amplification electronic equipment according to claim 11, wherein said first, second and third conductive tracks are metal tracks made of copper.

14. The power amplification electronic equipment according to claim 13, wherein said copper has a thickness ranging between 17 μm and 70 μm.

15. The power amplification electronic equipment according to claim 11, wherein said first, second and third conductive tracks are each shaped so as to form a serpentine path.

16. The power amplification electronic equipment according to claim 11, wherein each of said first, second and third conductive tracks has a length of about λ/4, where λ represents a wavelength of the signal at a center of a pass-band of the electric transformer device.

17. The power amplification electronic equipment according to claim 16, having an operative frequency band ranging between 760-960 MHz.

18. The power amplification electronic equipment according to claim 11, wherein said second conductive track is substantially symmetrical relative to the third conductive track.

19. The power amplification electronic equipment according to claim 11, wherein the electric transformer device has an insertion loss of about 0.1 dB.

20. An electric transformer device, comprising:

a support plate having a first base face and an opposite second base face;

a first port connectable to a differential signal line at a first signal terminal and a second signal terminal;

a second port connectable to a single-ended signal line at a third signal terminal and a ground node;

a first conductive track mounted on said first base face, the first conductive track having a first serpentine path electrically connecting the first signal terminal said first port to the third signal terminal of said second port;

a second conductive track mounted on said second base face, the second conductive track having a second serpentine path electrically connecting the first signal terminal of said first port to the ground node of said second port; and a third conductive track mounted on said second base face, the third conductive track having a third serpentine path electrically connecting the second signal terminal of said first port to the ground node of said second port;

wherein the first serpentine path matches and is aligned with the second serpentine path; and wherein the second and third serpentine paths are symmetric mirror images of each other.

* * * * *